United States Patent [19]

Tsui et al.

[11] Patent Number: 5,198,748

[45] Date of Patent: Mar. 30, 1993

[54] FREQUENCY MEASUREMENT RECEIVER WITH BANDWIDTH IMPROVEMENT THROUGH SYNCHRONIZED PHASE SHIFTED SAMPLING

[75] Inventors: James B. Y. Tsui, Dayton; David L. Sharpin, Springfield, both of Ohio

[73] Assignee: The United States of America as represented by the Secretary of the Air Force, Washington, D.C.

[21] Appl. No.: 783,662

[22] Filed: Oct. 28, 1991

[51] Int. Cl.$^5$ .......................................... G01R 23/16
[52] U.S. Cl. .................. 324/76.35; 324/77.11; 324/76.47; 324/76.55; 324/76.44; 324/76.21; 341/123; 364/485; 342/99; 342/192; 342/196
[58] Field of Search ................... 341/123; 342/18, 20, 342/98, 192, 99, 196; 364/484, 485; 367/90, 94; 324/79 R, 79 D, 78 D, 78 R, 77 B, 77 H

[56] References Cited

U.S. PATENT DOCUMENTS

| | | |
|---|---|---|
| 3,708,746 | 1/1973 | Willett . |
| 3,720,816 | 3/1973 | Keller .............................. 324/77 R |
| 3,991,365 | 11/1976 | Takeuchi . |
| 4,336,541 | 6/1982 | Tsui et al. . |
| 4,414,505 | 11/1983 | Cuckson et al. . |
| 4,451,782 | 5/1984 | Ashida . |
| 4,504,785 | 3/1985 | Tucker et al. . |
| 4,633,516 | 12/1986 | Tsui . |
| 4,644,267 | 2/1987 | Tsui et al. . |
| 4,720,674 | 1/1988 | Takeuchi .......................... 324/77 B |
| 4,730,257 | 3/1988 | Szeto .............................. 324/77 B |
| 4,150,378 | 4/1979 | Barton .............................. 342/107 |
| 4,798,467 | 1/1989 | Wyeth et al. . |
| 4,804,963 | 2/1989 | Clapham .......................... 367/105 |
| 4,860,318 | 8/1989 | Shaw et al. . |
| 4,893,266 | 1/1990 | Deem . |
| 4,963,816 | 10/1990 | Tsui et al. . |
| 5,099,194 | 3/1992 | Sanderson ..................... 324/79 D |
| 5,099,243 | 3/1992 | Tsui ................................ 324/77 B |
| 5,109,188 | 4/1992 | Sanderson ..................... 324/78 D |

Primary Examiner—Kenneth A. Wieder
Assistant Examiner—Jose M. Solis
Attorney, Agent, or Firm—Bernard E. Franz; Donald J. Singer

[57] ABSTRACT

A technique covered by patent applicaton S.N. 07/672,309 divides power of an input signal to two A/D converters. A processor receives the outputs of the two A/D converters. The input signal is subjected to a known delay $\tau$ for one of the converters, and both original and delayed signals are sampled simultaneously. Both sampled signals are Fourier transformed and the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform. The phase difference between the original and delayed signals is calculated and an approximation to the true frequency for each peak observed in the amplitude spectrum is estimated using the expression $$\phi = 2\pi f\tau$$

where $\tau$ is the delay. Herein the input signal is downconverted into two parallel paths with frequencies which differ by $f_s/4$ where $f_s$ is the sampling rate. The alias boundaries are at multiples of $f_s/2$. The output signals are divided again into two paths to form the delayed and undelayed paths. The digitized data will be processed as in the phase shifted sampling approach above. Since the four digitizers are operated at a synchronized speed, the outputs will be processed at one single clock rate.

1 Claim, 4 Drawing Sheets

FREQUENCY MEASUREMENT RECEIVER WITH BANDWIDTH IMPROVEMENT THROUGH SYNCHRONIZED PHASE SHIFTED SAMPLING

RIGHTS OF THE GOVERNMENT

The invention described herein may be manufactured and used by or for the Government of the United States for all governmental purposes without the payment of any royalty.

CROSS REFERENCE TO RELATED APPLICATIONS

There are four related applications: (1) Digital Frequency Measurement Receiver With Bandwidth Improvement Through Multiple Sampling of Complex Signals, serial number 07/672,515 filed Mar. 6, 1991 by James B. Y. Tsui and Richard B. Sanderson, now U.S. Pat. No. 5,099,243, issued Mar. 24, 1992; (2) Digital Frequency Measurement Receiver With Bandwidth Improvement Through Multiple Sampling of Real Signals, Ser. No. 07/672,310 filed Mar. 6, 1991 by Richard B. Sanderson and James B. Y. Tsui, now U.S. Pat. No. 5,099,194, issued Mar. 24, 1992; (3) Instantaneous Frequency Measurement Receiver With Bandwidth Improvement Through Phase Shifted Sampling of Real Signals, Ser. No. 07/672,309 filed Mar. 6, 1991 by Richard B. Sanderson and James B. Y. Tsui, now U.S. Pat. 5,109,188, issued Apr. 28, 1992; and (4) Frequency Measurement Receiver With Bandwidth Improvement Through Phase Shifted Sampling of Real Signals Using Sampling Rate Selection, Ser. No. 07/726,093 filed Jul. 5, 1991 by Richard B. Sanderson and James B. Y. Tsui. These four pending patent applications are hereby incorporated by reference.

BACKGROUND OF THE INVENTION

The present invention relates generally to an instantaneous frequency measurement receiver with bandwidth improvement through phase shifted sampling of real signals.

The conventional Instantaneous Frequency Measurement (IFM) receiver is a radio frequency (RF) receiver used primarily in electronic warfare (EW). Its basic function is to measure the frequency of pulsed signals radiated from hostile radar. Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length. Since the phase differences between the delayed and non-delayed receiver paths are functions of the input signal frequency, conversion of the phase difference signals to video provides signals whose amplitudes are related to the phase delay. These video signals typically take the form $\sin \omega \tau$ or $\cos \omega \tau$, where $\omega$ is the angular frequency of the processed input signal. The $\sin \omega \tau / \cos \Omega \tau$ signals are delivered to the encoding network which makes amplitude comparisons of the signals, determines the numerical value of $\omega$, and generates the digital frequency descriptive word.

An IFM receiver has many attractive features necessary for EW applications, such as small size, light weight, wide instantaneous bandwidth, and fine frequency resolution.

In a digital RF receiver, the incident radiation is mixed with a local oscillator signal and down converted to an intermediate frequency (IF). This IF signal is discretely sampled and further processing is done using digital techniques. The frequency of the incident radiation may be determined by performing a discrete Fourier transform on the sampled signal. The range of frequencies that can be determined by such methods is limited by aliasing effects that limit the frequency range to $f_s/2$, the Nyquist frequency, where $f_s$ is the uniform sampling frequency. In order to measure frequencies over a wide range, a very high sampling frequency must be used.

U.S. Pat. Nos. of interest include:
4,963,816- Tsui et al
4,860,318- Shaw et al
4,798,467- Wyeth et al
4,644,267- Tsui et al
4,633,516- Tsui
4,504,785- Tucker et al
4,451,782- Ashida
4,414,505- Cuckson et al
4,336,541- Tsui
3,991,365- Takeuchi
3,708,746- Willet The patent to Tsui et al 4,963,816 discloses use of two delay lines to provide fine frequency resolution and at the same time cover a wide input bandwidth. The patent to Shaw et al 4,860,318 discloses an apparatus that detects the presence of long or short pulse phase keyed (PSK) modulated signals and determine the underlying clock frequency and modulation code associated with such signal, in real time, using an instantaneous frequency measurement (IFM) receiver as its source, without affecting the bandwidth or sensitivity of this receiver. The patent to Wyeth et al 4,798,467 discloses a system that utilizes heterodyning of a pulsed laser beam to form a beat signal. The beat signal is processed by a controller or computer which determines both the average frequency of the laser pulse and any changes or chirp of the frequency during the pulse. The patent to Tsui et al 4,644,267 discloses a system that makes use of an interferometric Bragg cell for the time delays needed by the multiple antenna inputs in an angle-of-arrival (AOA) measurement system for accurate measurement over wide bandwidths. The patent to Tsui 4,633,516 discloses an IFM receiver with an A/D converter which permits elimination of a phase correlator. Patent No. 4,504,785 to Tucker et al discloses a sampling spectrum analyzer wherein an input signal is split and each resulting portion is passed down a tapped delay line with samples being taken at each tap processed by separate arithmetic units. The patent to Ashida 4,451,782 discloses an intermediate frequency oscillator and the outputs from a sweep oscillator are frequency mixed to obtain a measuring signal, which is provided to a device under test. The patent to Cuckson et al 4,414,505 discloses an apparatus for the instantaneous measurement of the frequency of pulsed microwave signals and particularly relates to the frequency measurement of pulsed radar where a train of pulses from one radar source has to be distinguished, and separated from radar pulses from another source on a real time, pulse-to-pulse basis. Patent No. 4,336,541, to Tsui discloses an IFM receiver that detects the difference of two or more RF signals between the onset of the first RF signal pulse and the completion of the frequency encoding strobe. The U.S. Pat. No. to Takeuchi 3,991,365 discloses a system for measuring in real time, by auto-correlation, the period and frequency of a periodic bio-medical source signal with random components such as an ultrasound doppler fetal heart beat signal. The U.S. Pat. No. to Willet 3,708,746 discloses a system for analyzing the frequency of an incident signal including a digital filter wherein the center frequency of the incident signal is varied by changing the sampling rate.

SUMMARY OF THE INVENTION

An objective of the invention is to simplify the design, in an RF receiver that measures the frequency of an incident signal, with bandwidth improvement through phase shifted sampling of real signals.

In the phase shifted sampling approach of U.S. Pat. No. 5,109,188 for an Instantaneous Frequency Measurement Receiver With Bandwidth Improvement Through Phase Shifted Sampling of Real Signals, an input signal is divided into two parallel paths: a delayed one and an undelayed one. Both the outputs are digitized and Fast Fourier Transform (FFT) is used to find the input frequency. In order to cover a wide bandwidth, the input frequency can be higher than the sampling rate. As a result, there are alias zones. The phase relationship between the delayed and the undelayed paths can be used to determine the alias regions. However, the leakage effect will affect the phase accuracy near the alias boundaries and result in catastrophic frequency error. To solve this problem, two sampling rates are adopted as shown in FIG. 1. There are three limitations associated with this approach. First, it is difficult to process two signals with different clock rates. Second, the bandwidth is limited to $(f_s \times f_s')/$(largest common divisor between $f_s$ and $f_s'$) where $f_s$ and $f_s'$ represent the two sampling frequencies. Third, the FFT of both outputs is needed. The output with peak frequency farther away from the alias boundaries will be used to determine the input frequency. This new invention will eliminate all three disadvantages.

According to the present invention, the input signal is down-converted into two parallel paths with different frequencies as shown in FIG. 2. The input signal is divided into two paths and each path has a mixer. The frequencies of the two local oscillators (LOs) differ by $f_s/4$ where $f_s$ is the sampling rate. The alias boundaries are at multiples of $f_s/2$. If the LO of the upper and lower paths are $f_o + f_s/4$, and $f_o$ respectively, the corresponding outputs are $f_i - (f_o + f_s/4)$ and $f_i - f_o$, where $f_i$ is the frequency of the input signal. The output signals are divided again into two paths to form the delayed and undelayed paths. It should be noted that the delay can be incorporated in the signal path or in the clock path. A total of four A/D converters are used. The digitized data will be processed as in the phase shifted sampling approach of patent application Ser. No. 07/672,309. Since the four digitizers are operated at a synchronized speed, the outputs will be processed at one single clock rate.

DETAILED DESCRIPTION

Bandwidth Improvement Through Phase Shifted Sampling of Real Signals - U.S. Pat. No. 5,109,188

Figure 1:
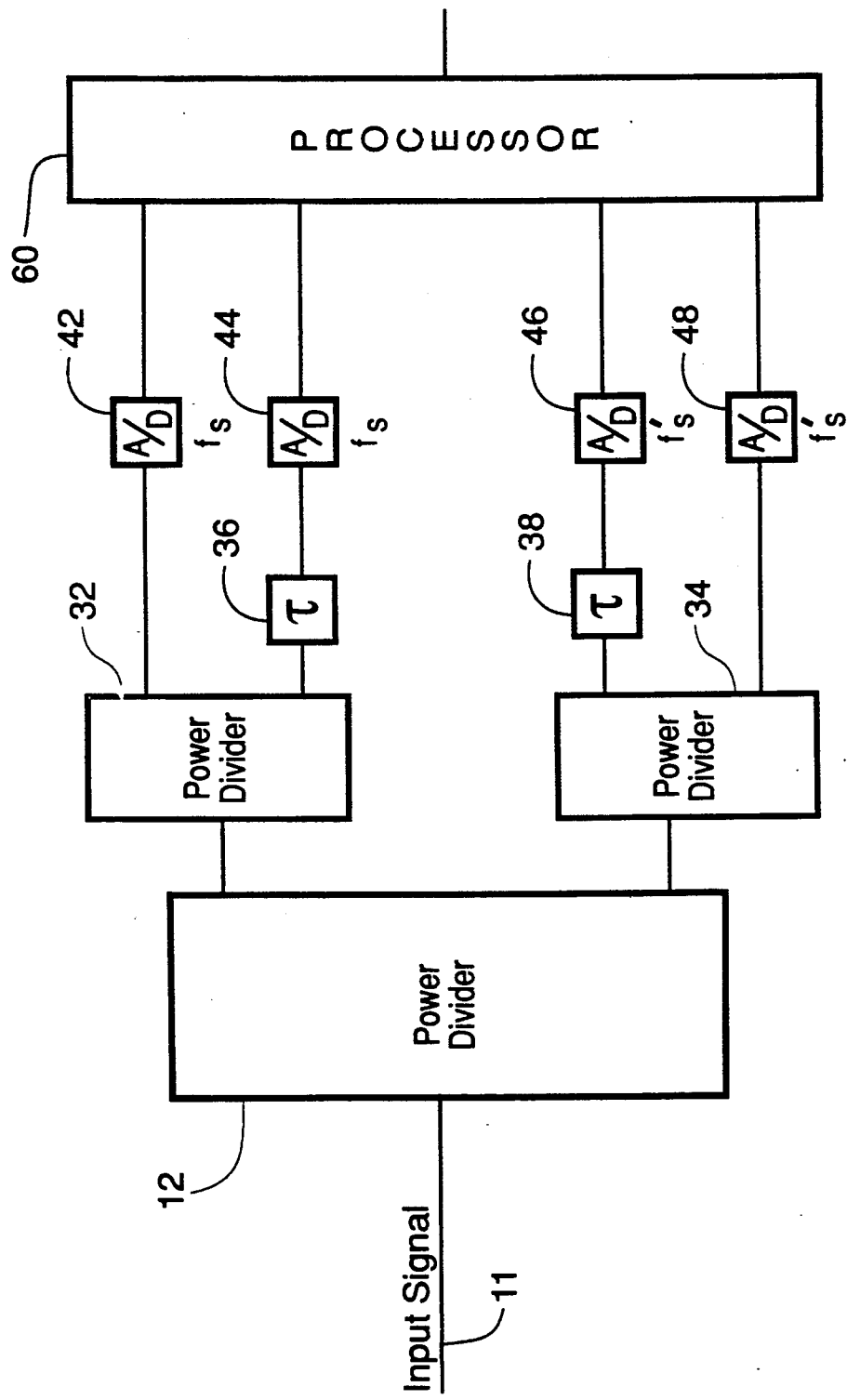
FIG. 1 is a functional block diagram showing a frequency measurement receiver with phase shifted sampling and A/D conversion as covered by U.S. Pat. No. 5,109,188.

The invention of U.S. Pat. No. 5,109,188 for an Instantaneous Frequency Measurement Receiver With Bandwidth Improvement Through Phase Shifted Sampling of Real Signals, overcomes the problem that in a digital receiver in order to measure frequencies over a wide range a very high sampling frequency must be used. This proposed approach to extending the frequency range is illustrated in FIG. 1. The incoming RF signal on line 11 is divided in power divider 12, and further divided by power dividers 32 and 34. One output of the power divider 32 is applied to an analog-to-digital converter 42, and the other is applied via a delay device 36 providing a delay $\tau$ to an analog-to-digital converter 44. The converters 42 and 44 are operated at a sampling frequency $f_s$.

To handle the cases in which the value of the frequency $f_s$ is too close to the boundary between aliases or the two signals are degenerate in the lowest alias, another pair of samples at a different sampling frequency $f_s'$ is used to shift the aliases so that the measured value does not lie on a boundary. One output of the power divider 34 is applied to an analog-to-digital converter 48, and the other is applied via a delay device 38 providing a delay $\tau$ to an analog-to-digital converter 46. The converters 46 and 48 are operated at a sampling frequency $f_s'$. The signals from the converters 42, 44, 46 and 48 are then supplied to a processor 60 to determine the frequency f.

In FIG. 1, the signal is subjected to a known delay $\tau$ and both original and delayed signals are sampled simultaneously. In the processor 60, both sampled signals are Fourier transformed and the phase and amplitudes calculated, using the expressions:

$$\phi(f) = tan^{-1} [I(f)/R(f)] \quad (1)$$

$$A(f) = [R^2(f) + I^2(f)]^{\frac{1}{2}} \quad (2)$$

where R(f) and I(f) are respectively the real and imaginary parts of the frequency transform. The phase difference between the original and delayed signals is calculated from the Fourier transform and a course approximation to the true frequency for each peak observed in the amplitude spectrum is estimated using the expression $$\phi = 2 \pi i \, f\tau \quad (3)$$

where $\tau$ is the delay and $\phi$ is the phase shift. When $f\tau < 1$, one can estimate the input frequency. The fine frequency resolution is obtained by locating the peaks in the amplitude spectrum.

If the phase shift is less than $\pi$, this procedure permits an estimate of the approximate value of the true frequency of the signal and, thus, permits determination of the alias which has been mapped to the observed frequency and correction of the observed frequency for aliasing. This may be accomplished in the following manner. Let $f_s$ be the sampling frequency, $f_{ph}$ be the frequency inferred from phase calculations, and f be the aliased frequency obtained from the amplitude spectrum. Repeatedly subtract $f_s$ from $f_{ph}$ until a value less than $f_s/2$ is obtained. If this value of $f_{ph}$ is less than zero, replace f by -f and calculate the corrected value of f to be $$f_{corr} = f + n f_s \qquad (4)$$

where n is the number of subtractions performed.

Figure 2:
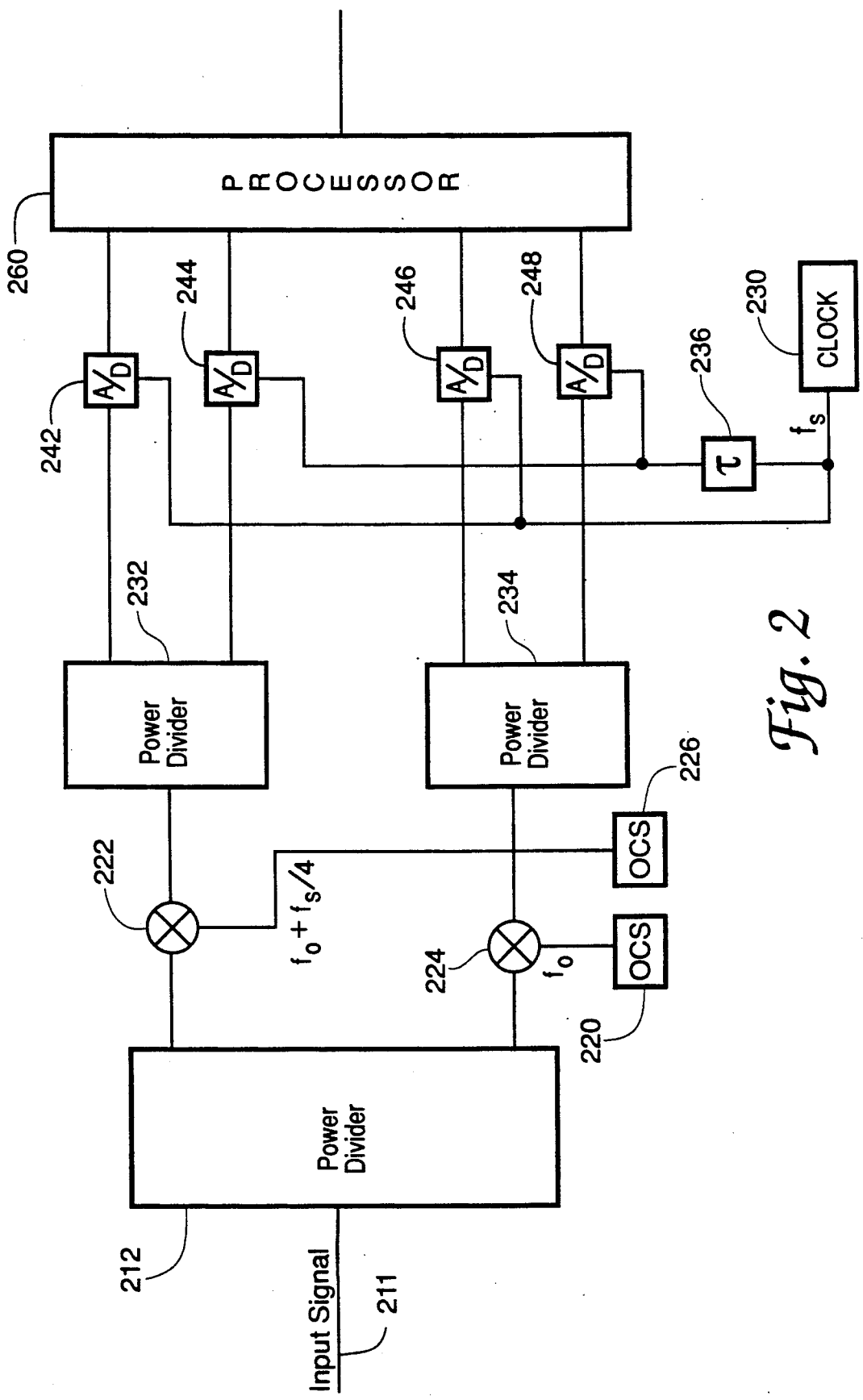
FIGS. 2 and 2a are functional block diagram showing a frequency measurement receiver with phase shifted synchronized sampling and A/D conversion, according to the invention.
Figure 2A:
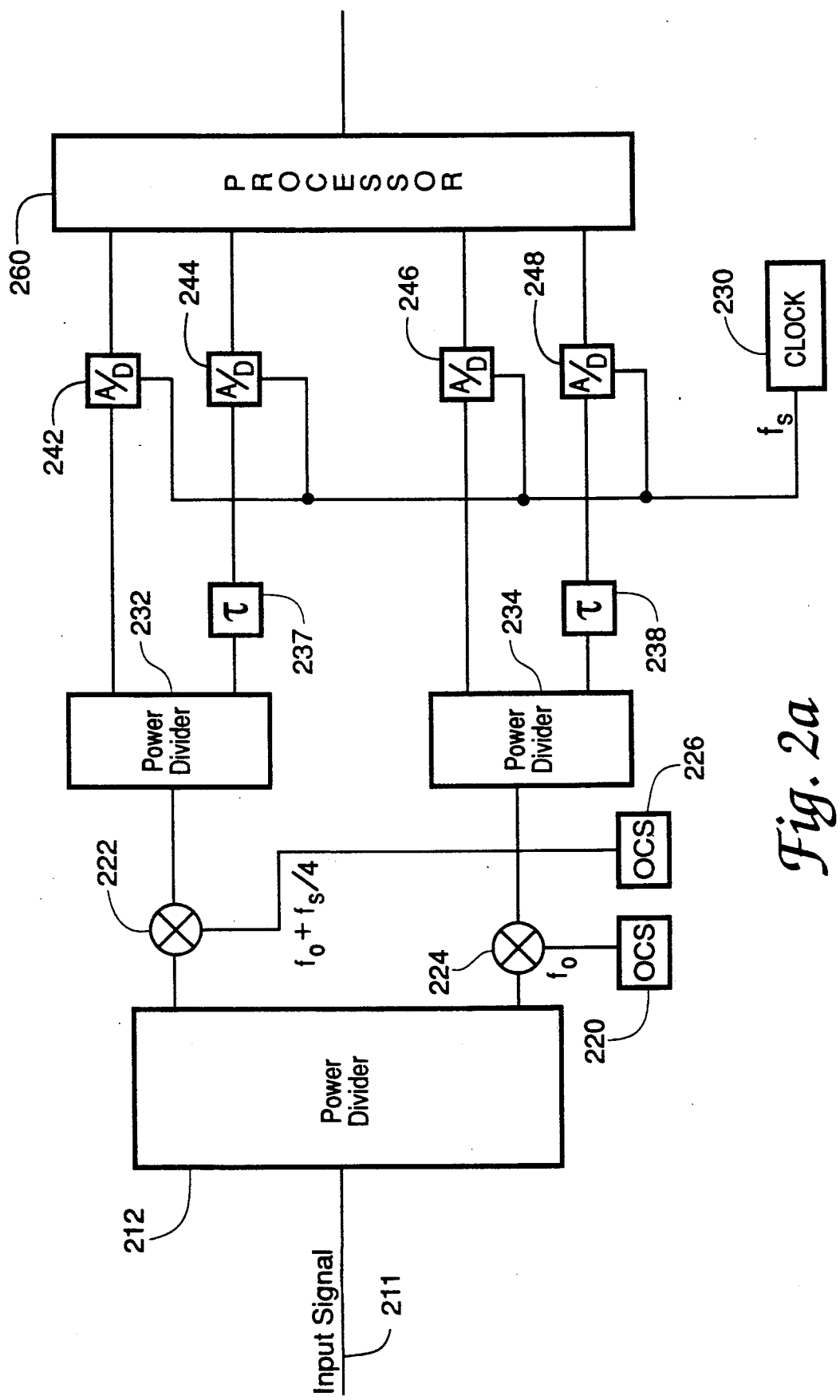

Frequency Measurement Receiver With Bandwidth Improvement Through Synchronized Phase Shifted Sampling In this approach, the input signal is down-converted into two parallel paths with different frequencies as shown in FIG. 2. The input signal on line 211 is divided by a power divider 212 into two paths and each path has a mixer. In one path a mixer 224 has inputs from a local oscillator 220 and the power divider 212, and in the other path a mixer 222 has inputs from a local oscillator 226 and the power divider 212. The frequencies of the two local oscillators (LOs) differ by $f_s/4$ where $f_s$ is the sampling rate. The alias boundaries are at multiples of $f_s/2$. If the frequencies of the local oscillators 222 and 224 of the upper and lower paths are $f_o + f_s/4$, and $f_o$ respectively, the corresponding outputs are $f_i - (f_o + f_s/4)$ and $f_i - f_o$, where $f_i$ is the frequency of the input signal. Each of the output signals is divided again into two paths to form the delayed and undelayed paths, with a power divider 232 coupled to the output of mixer 222, and a power divider 234 coupled to the output of mixer 224. A total of four A/D converters are used, with converters 242 and 244 coupled between outputs of the power divider 232 and inputs of the processor 260, and with converters 246 and 248 coupled between outputs of the power divider 234 and inputs of the processor 260. A clock 230 provides a signal at the sampling frequency $f_s$, which is coupled to the four A/D converters. It should be noted that the delay can be incorporated in the signal path or in the clock path. In FIG. 2, the delay is incorporated in the clock path, with a delay unit 236 coupled between the clock 230 and the two converters 244 and 248 to provide a delay $\tau$. FIG. 2a shows the delay incorporated in the signal paths, with a delay unit 237 between power divider 232 and the A/D converter 244, and with a delay unit 238 between power divider 232 and the A/D converter 248, each providing a delay $\tau$. The digitized data will be processed in the processor 260 as in the phase shifted sampling approach of patent application Ser. No. 07/672,309.

Since the four digitizers are operated at a synchronized speed, the outputs will be processed at one single clock rate.

Figure 3:
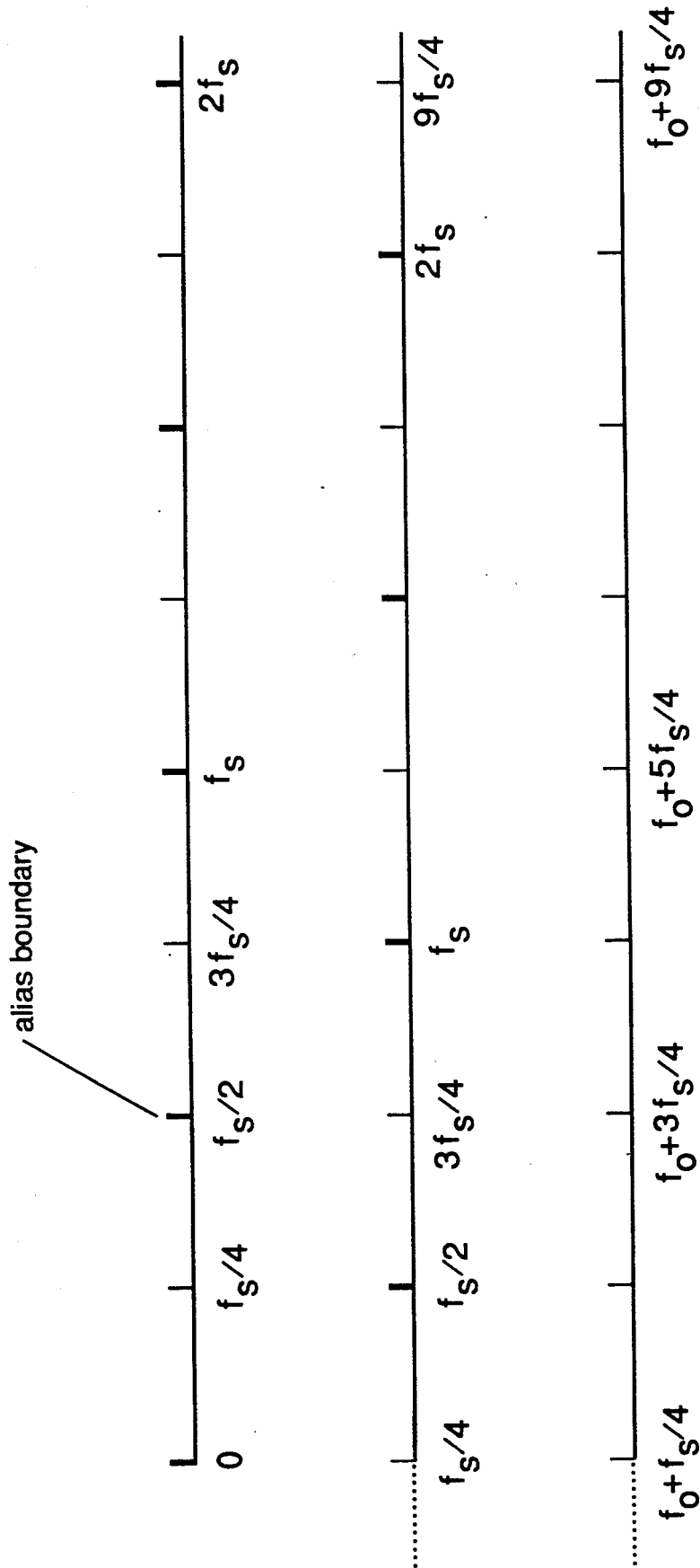
FIG. 3 is a set of graphs showing the effects of synchronized sampling.

In this approach, the frequencies of the input, upper and lower channels can be shown as in FIG. 3. The top line represents the upper path, the second represents the lower path and the bottom line represents the input signal. The heavy marks represent the alias boundaries of the upper and lower channels. It should be noted that the aliases are alternative in the upper and lower paths with the same spacing. Therefore, if a signal falls near the alias zone in one channel, it will be in the center of the other channel. Therefore, after performing the FFT in one channel, if the frequency is in the center region of the channel, it is not needed to perform the FFT in the second channel. Otherwise, the FFT should be performed on the second channel. This is different from the method of the previous application. In that approach, the FFT must be performed on both channels. If the two frequency readings are different, the frequency closer to the center of the channel will be used to determine the input frequency. Thus, the suggested approach will save processing time.

Since the two sampling frequencies are the same, the alias zones have the same width. Thus, the zone boundaries will not overlap. Theoretically, the bandwidth is not limited by the zone boundary overlap.

This approach has one disadvantage in the case of simultaneous input signals. When two signals arrive at the receiver at the same time and their frequencies are different by $nf_s$, where n is an integer, this method can not read both frequencies. However, if the frequency separation is different from $nf_s$, this method can read both frequencies. The method discussed in the original Phase Shifted Sampling of U.S. Pat. No. 7/672,309 does not have this limitation. Theoretically, this approach can read frequencies of two signals with three pairs of ADCs which is one pair more than the phase shifted method of U.S. Pat. No. 5,109,188. 7/672,309.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver comprising:
   first power dividing means coupling a source of signals to inputs of first and second mixers, a first oscillator having a frequency $f_o$ coupled to an input of the first mixer, a second oscillator having a frequency $f_o + f_s/4$ coupled to an input of the second mixer, wherein $f_s$ is a sampling frequency, the first and second mixers having outputs coupled respectively to inputs of second and third power dividing means, first and second analog-to-digital converters having inputs coupled to outputs of the second power dividing means, third and fourth analog-to-digital converters having inputs coupled to outputs of the third power dividing means, means for operating the first, second, third and fourth analog-to-digital converters at said sampling frequency $f_s$, delay means providing a delay $\tau$ between the sampling time of the first and second analog-to-digital converters and also a delay $\tau$ between the sampling time of the third and fourth analog-to-digital converters; outputs of the first, second, third and fourth analog-to-digital converters being coupled to processing means;
   wherein said processing means comprises means for performing Fourier transforms on signals from the first and second analog-to-digital converters, with the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform, means for calculating the phase difference between the original and delayed signals and for estimating an approximation to the true frequency for each peak observed in the amplitude spectrum using the expression $\phi = 2\pi f \tau;$ means for inferring a frequency $f_{ph}$ from phase calculations, and using an aliased frequency f obtained from the amplitude spectrum, means for obtaining an estimate of the approximate value of the true frequency of the signal and, thus, determination of the alias which has been mapped to the observed frequency and correction of the observed frequency for aliasing, means for repeatedly subtracting the value of the sampling frequency $f_s$ from the value of the frequency $f_{ph}$ until a value less than $f_s/2$ is obtained, if this value of $f_{ph}$ is less than zero, replacing f by $-f$ and calculating the corrected value of f to be $f_{corr} = f + n\, f_s$ where n is the number of subtractions performed;

and means responsive to the signal resulting from the processing of signals from the first and second analog-to-digital converters falling near an alias zone for processing signals from the third and fourth analog-to-digital converters, as set forth above for signals from the first and second analog-to-digital converters, to determine the value of the true frequency.

* * * * *

UNITED STATES PATENT AND TRADEMARK OFFICE
CERTIFICATE OF CORRECTION

PATENT NO. : 5,198,748
DATED : March 30, 1993
INVENTOR(S) : James B.Y. Tsui et al It is certified that error appears in the above-identified patent and that said Letters Patent is hereby corrected as shown below:

Column 1, line 59, "$\Omega\tau$" should be -- $\omega\tau$ --.

Column 6, line 14, "7/672,309" should be -- 5,109,188 --.
Column 6, line 18, "7/672,309" should be deleted.
Column 6, line 36, a hyphen should follow "respec".

Signed and Sealed this

Eighth Day of February, 1994

Attest:

BRUCE LEHMAN

Attesting Officer    Commissioner of Patents and Trademarks